United States Patent [19]

Lafferty et al.

[11] 4,262,261
[45] Apr. 14, 1981

[54] AMPLIFIER CIRCUIT

[75] Inventors: Edwin C. Lafferty; James H. Gibson, both of Lynchburg, Va.

[73] Assignee: General Electric Company, Lynchburg, Va.

[21] Appl. No.: 21,850

[22] Filed: Mar. 19, 1979

[51] Int. Cl.³ .............................................. H03F 3/45
[52] U.S. Cl. .................................... 330/261; 330/257
[58] Field of Search ................ 330/252, 255, 257, 261

[56] References Cited

U.S. PATENT DOCUMENTS 3,668,320  6/1972  Duck .................................... 179/1 A

OTHER PUBLICATIONS

LePage et al., "Voltage-To-Current Converter", *IBM Technical Disclosure Bulletin*, vol. 19, No. 4, Sep. 1976, pp. 1375-1376.

*Primary Examiner*—James B. Mullins
*Attorney, Agent, or Firm*—James J. Williams

[57] ABSTRACT

An amplifier is provided with two transistors connected as a differential amplifier having an emitter current source. Input signals are applied to one transistor and output signals are derived from the other transistor. These output signals are applied to an output transistor also connected as a current source that is one-half the emitter current source of the differential amplifier. This provides a steady state output voltage from the output transistor that can be set at a desired level to provide symmetrical limiting.

12 Claims, 3 Drawing Figures

AMPLIFIER CIRCUIT

BACKGROUND OF THE INVENTION

Our invention relates to an improved amplifier circuit, and particularly to an improved amplifier circuit capable of being connected in cascade to provide high gain, operating from a relatively low voltage source and still providing relatively constant gain despite changes in the voltage, and providing symmetrical operation despite changes in the voltage or temperature.

In battery powered radio or electronic equipment, the trend is toward smaller circuits with improved or increased functions, and at the same time with less power demands on the battery.

Accordingly, a general object of our invention is to provide a new and improved battery powered amplifier circuit that requires relatively little current, and that can be connected in cascade with additional circuits to provide the desired overall gain.

Another object of our invention is to provide a new and improved amplifier circuit that provides symmetrical limiting, and that has amplitude and symmetry characteristics that are substantially independent of battery voltage and ambient temperature.

Another object of our invention is to provide a new and improved amplifier that is capable of being readily made in integrated circuit form with a plurality of stages connected in series or cascades to provide the desired overall gain.

Another object of our invention is to provide a new and improved amplifier circuit that provides a gain of 18 Db, but that requires a current of only 75 microamperes at a voltage of 1.1 volts, thus making it ideal for battery powered equipment.

Another object of our invention is to provide a series or cascade of new and improved amplifier circuits, each of which provides a gain of 18 Db while requiring a current of only 75 microamperes at a voltage of 1.1 volts, thus making it ideal for battery powered equipment.

In order that the life of a battery for an amplifier be as long as possible, the amplifier should be able to operate over as wide a range of voltages as possible.

Accordingly, another object of our invention is to provide a new and improved amplifier circuit that has relatively stable gain and symmetrical characteristics despite a relatively wide variation in supply voltage, thereby increasing the useful life of a battery that supplies the amplifier voltage.

Another object of our invention is to provide a new and improved amplifier circuit that provides relatively constant gain with battery supply voltages as low as 1.1 volts.

SUMMARY OF THE INVENTION

Briefly, these and other objects are achieved in accordance with our invention by a series of amplifier circuits each of which includes first and second transistors connected as a differential amplifier, and with the transistor bases connected to a regulated voltage. The transistors are provided with a current source of selected magnitude. Input signals are applied to the first transistor. A current source and a third transistor are connected to the second transistor so that the output current through the third transistor is approximately one-half the total current through the differential amplifier. This output current is supplied to a load selected to set the midpoint output voltage at a desired level. Signals derived from across the output load are symmetrical, and are independent of temperature where the regulated supply is temperature compensated to match the current sources.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF THE PREFERRED EMBODIMENT

Figure 1A:
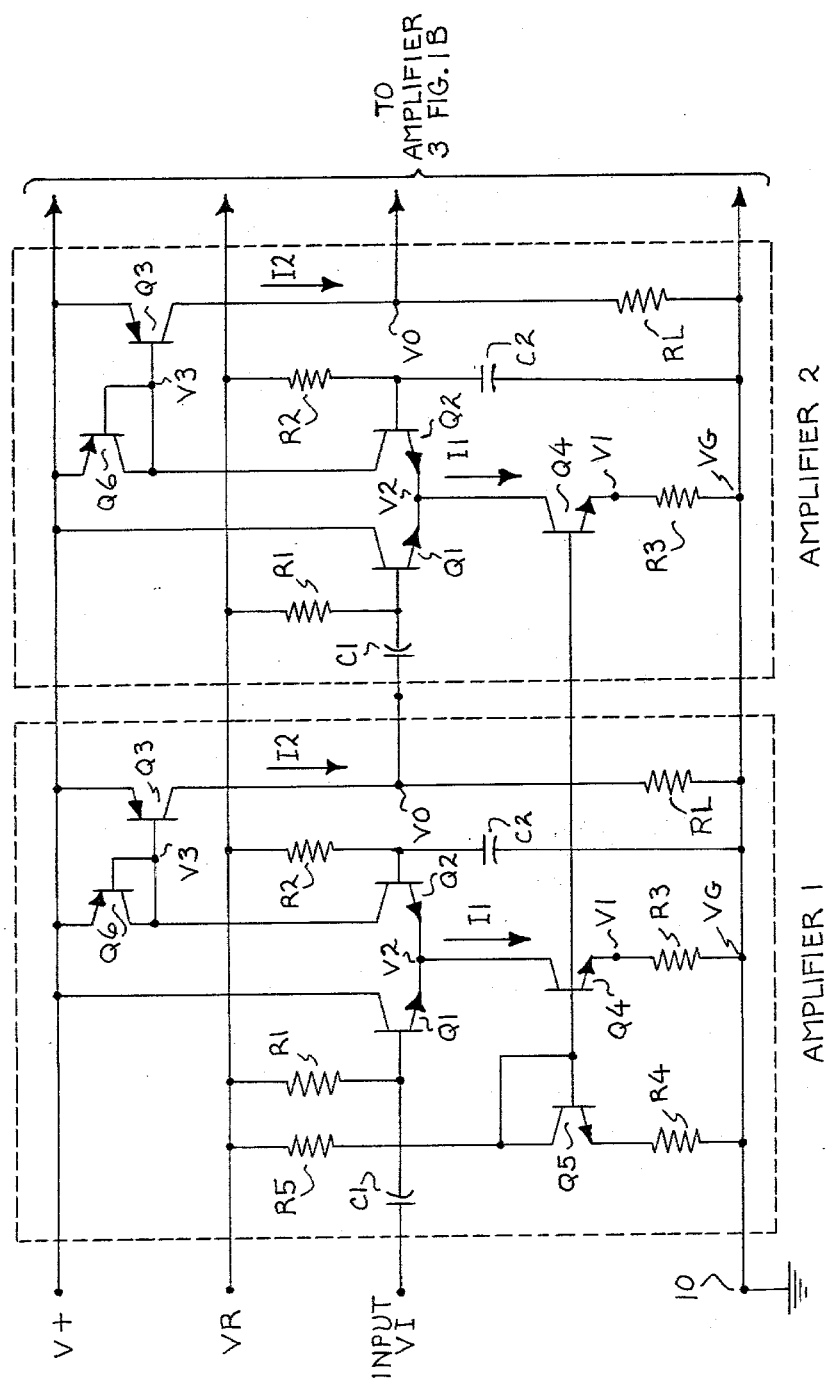
FIGS. 1A and 1B show a preferred circuit diagram of a series or cascade of four improved amplifiers in accordance with our invention.
Figure 1B:
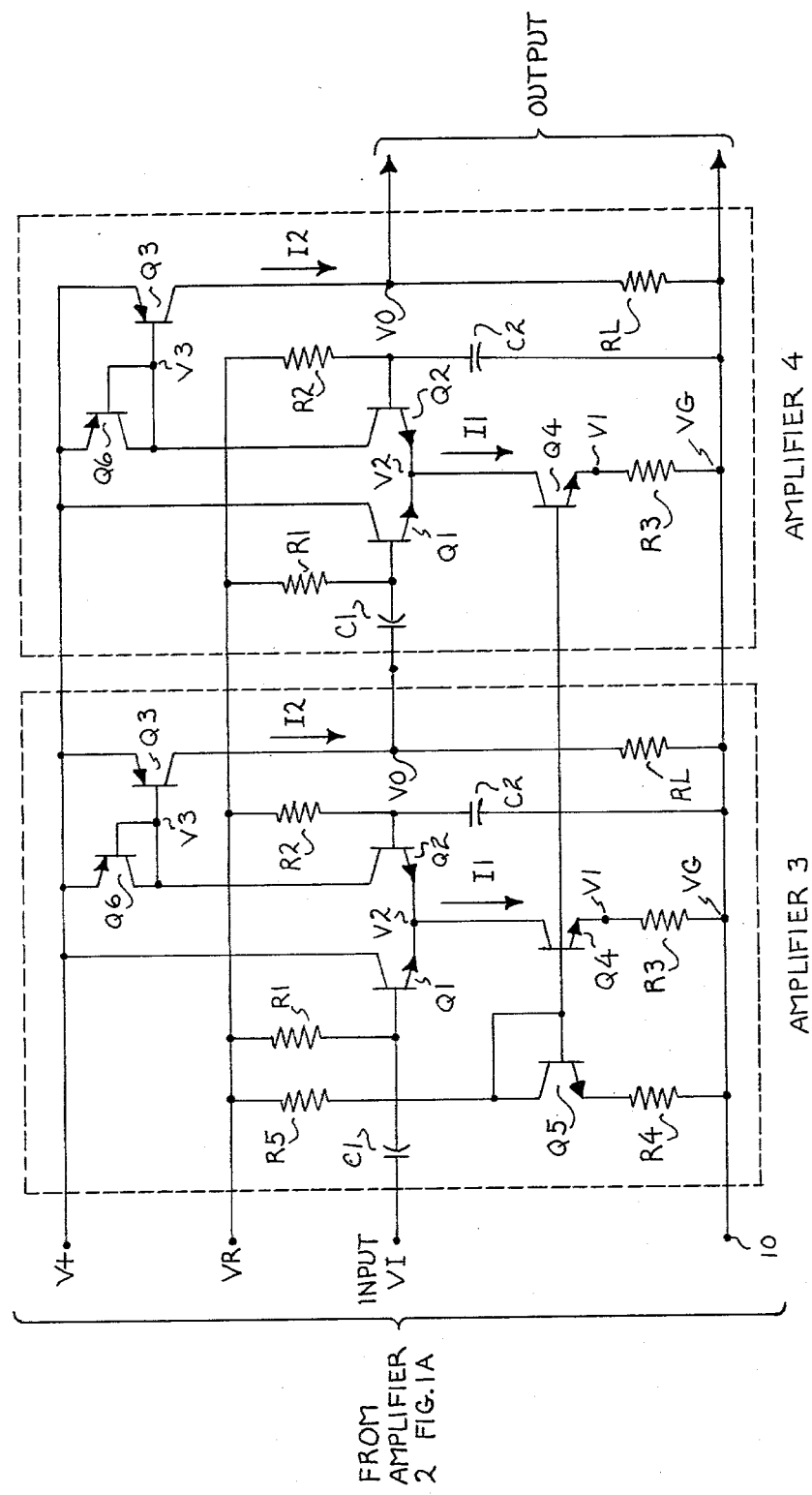

FIGS. 1A and 1B are to be considered together with the right hand lines of FIG. 1A connected to the left hand lines of FIG. 1B to provide a cascade or series of four amplifiers. Our amplifier can be utilized by itself or with any number to provide the desired gain, such as in an intermediate frequency (IF) amplifier in a radio receiver for example. Each of our amplifiers comprises two NPN transistors Q1, Q2 with their emitters connected together in a differential amplifier arrangement. The bases of the transistors Q1, Q2 are connected through respective and equal magnitude resistors R1, R2 to a source of regulated voltage VR that is positive with respect to a reference potential or ground 10. As will be mentioned later, we prefer that the source of regulated voltage VR be compensated with respect to temperature to match the characteristics of an NPN transistor Q5 serving as a control diode by connecting the collector to the base. The base of the transistor Q2 is grounded for alternating current by a capacitor C2. The emitters of the transistors Q1, Q2 are connected to the collector of a current source, NPN type transistor Q4. The emitter of the transistor Q4 is connected through a resistor R3 to the ground 10. The base of the transistor Q4 is connected to the collector of the control diode transistor Q5. Two transistors Q4 (in amplifiers 1 and 2 for example) may be connected to one control diode transistor Q5 as shown. If a bypass capacitor is connected between the bases of all Q4 transistors and the ground 10, one diode transistor Q5 could serve four transistors Q4. We prefer that the transistor Q5 have the same characteristics (preferably matched) as the transistor Q4. The emitter of the transistor Q5 is connected through a resistor R4 to the ground 10, and the base and collector of the transistor Q5 are connected through a resistor R5 to the regulated voltage source VR.

The collector of the transistor Q1 is connected to a source of voltage V+ which is greater than the regulated voltage VR. The collector of the transistor Q2 is connected to the source of voltage V+ through a PNP type transistor Q6 which has its collector and base connected together to form a control diode. The collector (or cathode) of the formed diode is connected to the base of a PNP type output transistor Q3 which forms a current source having the same characteristics as the diode transistor Q6. The emitter of the transistor Q3 is connected to the source voltage V+, and the collector of the transistor Q3 is connected through an output load resistor RL to the ground 10. Input signals are applied to the base of the transistor Q1 preferably through an isolating capacitor C1, and output signals are derived from the collector of the transistor Q3 preferably also through an isolating capacitor.

In the particular application for our amplifier circuit of FIG. 1, the source voltage V+ was assumed to vary from 1.5 to 1.1 volts. The regulated voltage source VR was arranged to be 900 millivolts, with a temperature coefficient of −2 millivolts per degree centigrade. For proper operation, the regulated voltage VR must be at least 900 millivolts above the ground 10. The resistors R3, R4 were selected to be 500 ohms each, and the resistor R5 was adjusted (or trimmed if on a circuit board or integrated circuit) to provide a current of 50 microamperes through the control diode Q5. Since the control transistor Q4 is matched with the transistor Q5 connected as the control diode, the collector current I1 through the transistor Q4 is 50 microamperes also. The resistors R3, R4 serve as current stabilizers, and thus increase the degree of match between the desired and actual current sources. The total current I1 of 50 microamperes through the differential amplifier transistors Q1, Q2 is divided equally in the absence of an input signal. Thus, half of this current flows through the diode connected transistor Q6, and the output transistor Q3 provides a current which is the same as the current through the diode transistor Q6. With this selected output current, the load resistor RL is selected to provide the desired midpoint output voltage, which we prefer to be 500 millivolts. This midpoint steady state voltage is substantially independent of the supply voltage B+ or temperature, so that the output is virtually independent of supply voltage and temperature, and provides symmetrical limiting.

Figure 2:
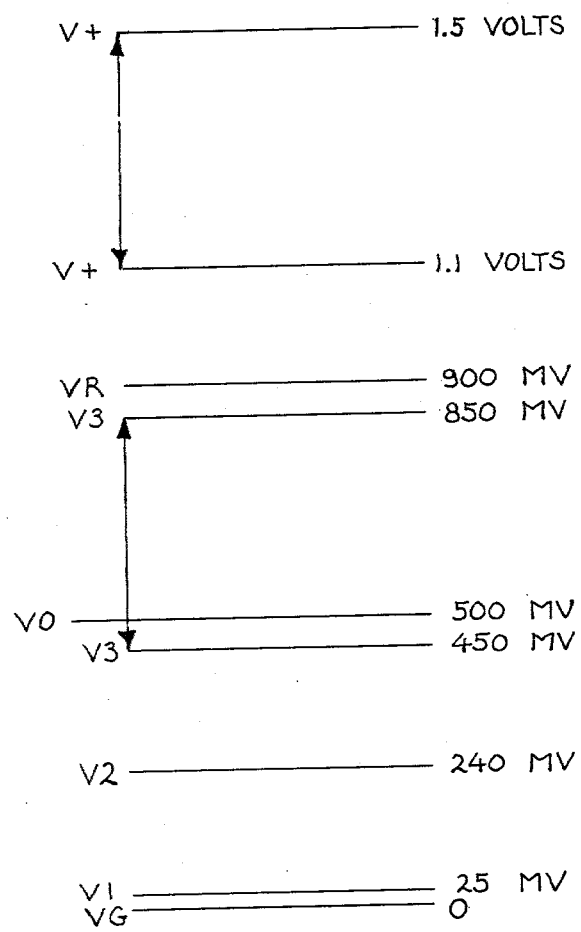
FIG. 2 shows voltage levels in each of the amplifiers of FIGS. 1A and 1B for explaining our improved amplifier.

The steady state direct current voltages at the designated points in FIG. 1 are shown in FIG. 2. The voltage as the ground 10 is indicated as VG; the voltage at the emitter of the transistor Q4 is indicated as V1; the voltage at the emitters of the transistors Q1, Q2 is indicated as V2; the voltage at the collector of the transistor Q2 and the base of the transistor Q3 is indicated as V3; and the voltage at the collector of the output transistor Q3 is indicated as V0. The voltage V1 is 25 millivolts for the current I1 of 50 microamperes through the 500 ohm resistor R3. The voltage V1 is the regulated voltage VR of 900 millivolts minus a voltage drop of approximately 10 millivolts across the resistor R1 and a voltage drop of approximately 650 millivolts across the base to emitter of the transistor Q1, or 240 millivolts. The voltage V3 is the V+ voltage of 1.5 to 1.1 volts minus the emitter-base voltage of the transistor Q6 of 650 millivolts, or 850 to 450 millivolts. The output voltage V0 and the regulated voltage VR and the V+ voltage are also indicated in FIG. 2.

With respect to alternating current signals applied to the input of our amplifier, the gain is a function of the load resistor RL and the emitter current level of the differential amplifier transistors Q1, Q2. For an input signal VI applied to the base of the transistor Q1, a signal VI/2 appears at the emitters of the transistors Q1, Q2. The gain from the emitter of the transistor Q2 to its collector is unity, since the load for the transistor Q2 is a diode connected transistor Q3 which is operated as the same current level as the transistor Q2. The voltage at the collector of the transistor Q2 is therefore VI/2 and this is applied to the base of the transistor Q3. The voltage gain of the transistor Q3 is the ratio of the load resistor RL to the dynamic emitter resistance of the transistor Q3. As is known, the dynamic emitter resistance is equal to 26 divided by the emitter current in milliamperes. The emitter current I2 of the transistor Q3 is one-half of the differential amplifier current I1 through the transistor Q4. Thus, the amplifier gain is approximately equal to the output resistor RL divided by twice the dynamic emitter resistance of the transistor Q3. As mentioned earlier, we prefer that the output voltage V0 be symmetrical. For the differential amplifier current I1 of 50 microamperes, the output current I2 is 25 microamperes. For an output voltage symmetrical about the voltage of 500 millivolts, the load resistor RL must equal 500 millivolts divided by 25 microamperes, or 20,000 ohms. The dynamic emitter resistance for a current of 25 microamperes is equal to 26 divided by 0.025, or approximately 1,040 ohms. The gain of one amplifier is then equal to 20,000 divided by 1,040 or theoretically 19.2 Db. However, there is some additional loss caused by the low Beta inherent in the lateral PNP transistor Q3 so that a realistic gain is 18 Db. For four amplifiers, the gain is approximately 75 Db. The bandwidth at this current level is approximately 400 kilohertz. This bandwidth increases as the current level increases. The bandwidth may be decreased by providing a capacitor across the load resistor RL. The low frequency response may be controlled by the capacitor C1.

When a relatively large signal is applied to the input, the transistor Q1 is turned completely on and off, so that the differential amplifier current through the transistor Q1 varies between 50 microamperes and 0. Conversely, the current through the transistor Q2 varies between 0 and 50 microamperes. The current I2 in the load resistor RL also varies between 0 and 50 microamperes (which results in the midpoint current of 25 microamperes mentioned earlier). For the load resistor of 20,000 ohms, the output voltage swings between 0 and 1 volt, and is independent of the supply voltage V+. While we have mentioned a range of 1.1 to 1.5 volts for the voltage V+, if the voltage V+ were 10 volts and the other values were the same as described, a 1 volt limited output would still be produced, since the output is substantially independent of the magnitude of the voltage V+. The gain can be increased with a higher voltage V+ by increasing the magnitude of the load resistor RL. Thus, our amplifier provides extremely symmetrical limiting independent of the input level, variations in the power supply voltage V+ and the temperature.

While we have shown and described only one embodiment of our invention, persons skilled in the art will appreciate the many modifications which can be made. For example, the symmetrical steady state point of the output voltage can be selected at any magnitude by adjusting the magnitude of the load resistor RL. The bases of the transistors Q2 may be connected together, and connected to the voltage VR by a single resistor and connected to the ground 10 by a single capacitor. In such a change, the single resistor is decreased to compensate for the current in the parallel arrangement. The capacitor may remain the same size, whether for one or a plurality of amplifiers. The currents I1, I2 can be selected as desired, although we prefer that the steady state current I2 be one-half the steady state current I1. And, of course, our amplifier can be operated with various voltages, various input signal levels, and different type of solid state devices. Our amplifier can be realized in many forms, including discrete components, or integrated circuits. Therefore while our invention has been described with reference to a particular embodiment, it is to be understood that modifications may be made without departing from the spirit of the invention or from the scope of the claims.

What we claim as new and desire to secure by Letters Patent of the United States is:

1. An improved amplifier circuit comprising:
   a. first and second transistors each having first and second current path electrodes and a control electrode;
   b. input means for applying an input signal to said control electrode of said first transistor;
   c. first means connecting said first current path electrodes of said first and second transistors through the current path electrodes of a first current source transistor to a first unregulated voltage source terminal;
   d. a diode connected to said first current source transistor, said diode being formed from a transistor that is matched to said first current source transistor;
   e. second means connecting said control electrodes of said first and second transistors to a regulated voltage terminal;
   f. third means connecting said second current path electrode of said first transistor to a second unregulated voltage source terminal;
   g. an output transistor having first and second current path electrodes and a control electrode;
   h. fourth means connecting said first and second current path electrodes of said output transistor between said first and second unregulated voltage source terminals;
   i. fifth means connecting said second unregulated voltage source terminal to said second current path electrode of said second transistor and to said control electrode of said output transistor to cause said output transistor to act as a second current source, said fifth means comprising a solid state device which is matched with said output transistor;
   j. and output means connected in series with said current path electrodes of said output transistor.

2. The improved amplifier circuit of claim 1 wherein said output means comprise a resistor of selected magnitude to provide an output voltage of predetermined magnitude in the absence of a signal applied to said input means.

3. An improved amplifier circuit comprising:
   a. first and second terminals for a source of unregulated voltage and third and fourth terminals for a source of regulated voltage;
   b. first and second transistors each having an emitter, a base, and a collector;
   c. a first current source transistor having an emitter, a base, and a collector;
   d. means connecting said emitter and collector of said first current source transistor between said emitters of said first and second transistors and said first voltage source terminal;
   e. a first control diode connected between said third and fourth voltage source terminals;
   f. means connecting said first control diode to said base of said first current source transistor;
   g. means connecting said bases of said first and second transistors to said third voltage source terminal;
   h. an input signal terminal connected to said base of said first transistor;
   i. means connecting said collector of said first transistor to said second voltage source terminal;
   j. a second control diode connected between said collector of said second transistor and said second voltage source terminal;
   k. an output transistor having an emitter, a base, and a collector;
   l. means including an output load connecting said emitter and collector of said output transistor between said first and second voltage source terminals;
   m. and means connecting said base of said output transistor to said collector of said second transistor.

4. The improved amplifier circuit of claim 3 wherein said first and second transistors form a differential amplifier having a first current, and wherein said output transistor has a second current substantially equal to one-half said first current.

5. The improved amplifier circuit of claim 3 or claim 4 and further including means connecting said first and fourth voltage source terminals together.

6. The improved amplifier circuit of claim 3 or claim 4 wherein said output load has a magnitude selected to provide a predetermined output voltage in the absence of a signal applied to said input signal terminal.

7. The improved amplifier circuit of claim 3 or claim 4 wherein said first current source transistor and said first control diode have matched characteristics, and wherein said output transistor and said second control diode have matched characteristics.

8. The improved amplifier circuit of claim 6 wherein said first current source transistor and said first control diode have matched characteristics, and wherein said output transistor and said second control diode have matched characteristics.

9. An improved amplifier circuit comprising:
   a. first and second terminals for a source of unregulated voltage and third and fourth terminals for a source of regulated voltage;
   b. first and second substantially similar transistors each having an emitter, a base, and a collector;
   c. a first current source transistor having an emitter, a base, and a collector;
   d. a first resistor and said emitter and collector of said first current source transistor connected in series between said emitters of said first and second transistors and said first voltage source terminal;
   e. a first control diode and a second resistor connected in series between said third and fourth voltage source terminals, said second resistor being substantially equal to said first resistor;
   f. means connecting said first control diode to said base of said first current source transistor;
   g. substantially equal third and fourth resistors respectively connected between said bases of said first and second transistors and said third voltage source terminal;
   h. an input signal terminal connected to said base of said first transistor;
   i. means connecting said collector of said first transistor to said second voltage source terminal;

j. a second control diode connected between said collector of said second transistor and said second voltage source terminal;

k. an output transistor having an emitter, a base, and a collector;

l. an output load resistor and said emitter and collector of said output transistor connected in series between said first and second voltage source terminals;

m. and means connecting said base of said output transistor to said collector of said second transistor.

10. An improved amplifier arrangement comprising:

a. first and second terminals for a source of unregulated voltage and third and fourth terminals for a source of regulated voltage;

b. a first control diode connected between said third and fourth source terminals;

c. and a plurality of individual amplifier circuits, each comprising:

1. first and second transistors each having an emitter, a base, and a collector;
2. a first current source transistor having an emitter, a base, and a collector;
3. means connecting said emitter and collector of said first current source transistor between said emitters of said first and second transistors and said first voltage source terminal;
4. means connecting base of said first current source transistor to said first control diode;
5. means connecting said bases of said first and second transistors to said third voltage source terminal;
6. an input signal terminal connected to said base of said first transistor;
7. means connecting said collector of said first transistor to said second voltage source terminal;
8. a second control diode connected between said collector of said second transistor and said second voltage source terminal;
9. an output transistor having an emitter, a base, and a collector;
10. means including an output load connecting said emitter and collector of said ouput transistor between said first and second voltage source terminals;
11. and means connecting said base of said output transistor to said collector of said second transistor;

d. and means connecting said output load of each individual amplifier circuit to said input signal terminal of the succeeding amplifier circuit.

11. The improved amplifier arrangement of claim 10 wherein each of said first and second transistors of each individual amplifier circuit form a differential amplifier having a first current, and wherein said output transistor has a second current substantially equal to one-half said first current.

12. The improved amplifier arrangement of claim 10 or claim 11 wherein each of said output loads has a magnitude selected to provide a predetermined output voltage in the absence of a signal applied to said input signal terminal.

* * * * *